United States Patent
Ino et al.

(10) Patent No.: US 9,686,450 B2
(45) Date of Patent: Jun. 20, 2017

(54) IMAGE CAPTURING APPARATUS, CONTROL METHOD THEREOF, AND STORAGE MEDIUM

(71) Applicant: CANON KABUSHIKI KAISHA, Tokyo (JP)

(72) Inventors: Kazuya Ino, Yokohama (JP); Takayuki Yasuda, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/809,475

(22) Filed: Jul. 27, 2015

(65) Prior Publication Data
US 2016/0037100 A1 Feb. 4, 2016

(30) Foreign Application Priority Data
Aug. 4, 2014 (JP) .................................. 2014-158986

(51) Int. Cl.
*H04N 5/217* (2011.01)
*H04N 5/361* (2011.01)
*H04N 5/365* (2011.01)
*H04N 5/3745* (2011.01)

(52) U.S. Cl.
CPC ............. *H04N 5/217* (2013.01); *H04N 5/361* (2013.01); *H04N 5/3651* (2013.01); *H04N 5/3745* (2013.01)

(58) Field of Classification Search
CPC ........ H04N 5/365; H04N 5/378; H04N 5/217; H04N 5/3745; H04N 5/3651; H04N 5/361
USPC .......................................................... 348/241
See application file for complete search history.

(56) References Cited

U.S. PATENT DOCUMENTS

| | | | | |
|---|---|---|---|---|
| 9,106,857 | B1 * | 8/2015 | Faramarzpour | H04N 5/3743 |
| 2005/0068431 | A1 * | 3/2005 | Mori | H04N 5/365 348/241 |
| 2005/0104981 | A1 * | 5/2005 | Findlater | H04N 5/3658 348/241 |
| 2007/0035642 | A1 * | 2/2007 | Takahashi | H04N 5/365 348/241 |
| 2008/0273101 | A1 * | 11/2008 | Takenaka | H04N 5/361 348/243 |
| 2008/0291290 | A1 * | 11/2008 | Sonoda | H04N 5/361 348/222.1 |
| 2009/0021611 | A1 * | 1/2009 | Utsugi | H04N 1/401 348/241 |
| 2009/0167913 | A1 * | 7/2009 | Takenaka | H04N 5/361 348/301 |

(Continued)

FOREIGN PATENT DOCUMENTS

JP 4144517 A 9/2008
JP 5132386 A 1/2013

*Primary Examiner* — Pritham Prabhakher
(74) *Attorney, Agent, or Firm* — Cowan, Liebowitz & Latman, P.C.

(57) ABSTRACT

An image capturing apparatus includes an image sensor having a plurality of pixels and being capable of outputting a plurality of image signals read out using different methods for individually reading out the signals of the plurality of pixels and correction signals for correcting the plurality of image signals, a processing unit for processing the correction signals so as to handle the reading methods for the plurality of image signals, and a correction unit for correcting the plurality of image signals using the correction signals processed by the processing unit.

12 Claims, 9 Drawing Sheets

(56) References Cited

U.S. PATENT DOCUMENTS

| | | | | |
|---|---|---|---|---|
| 2010/0141808 A1* | 6/2010 | Nakajima | ............ | H04N 5/3651 348/241 |
| 2010/0182451 A1* | 7/2010 | Kita | ................ | H04N 5/2355 348/229.1 |
| 2011/0128419 A1* | 6/2011 | Moore | ................ | H04N 5/335 348/241 |
| 2011/0128420 A1* | 6/2011 | Moore | ................ | H04N 5/3658 348/241 |
| 2012/0075505 A1* | 3/2012 | Van Beek | ............ | H04N 5/2173 348/241 |
| 2013/0278803 A1* | 10/2013 | Tsurube | ................ | H04N 5/361 348/300 |

* cited by examiner

IMAGE CAPTURING APPARATUS, CONTROL METHOD THEREOF, AND STORAGE MEDIUM

BACKGROUND OF THE INVENTION

Field of the Invention

The present invention relates to an image capturing apparatus, a control method thereof and a storage medium.

Description of the Related Art

Generally, in an image capturing apparatus provided with an image sensor such as a CCD or CMOS image sensor, correction processing is performed for phenomena influencing image quality, such as fixed-pattern noise, shading, and flickers that occur inside the image sensor. In correction processing, correction values for the respective phenomena are generated from image signals output from the image sensor, and the image signals are corrected using the generated correction values.

Incidentally, in recent image sensors, demand for an increased number of pixels and high speed image capturing has further increased, and there has been demand to perform signal processing at a high speed. Therefore, it has become necessary to increase the speed of a circuit for processing analog signals output from pixels. Accordingly, various parallel reading processing techniques have been proposed, such as simultaneously reading out analog signals output from pixels for each column, and in subsequent horizontal transfer, providing a plurality of amplifiers as output units, instead of intensively using one amplifier. Such parallel reading processing techniques have made it possible to increase the number of pixels and to capture images at a high speed. However, even if respective circuits for performing parallel reading processing are designed similarly in terms of layout design, variation in the properties thereof arise due to variation in manufacturing processes and the like. These property variations appear as stripe-shaped fixed-pattern noise in output images.

Accordingly, for example, Japanese Patent No. 4144517 discloses a method for calculating correction values for correcting fixed-pattern noise using a plurality of frames, with fixed-pattern noise detection rows for detecting fixed-pattern noise provided on an image sensor. In this method, even in the case where a sufficient number of fixed-pattern noise detection rows cannot be obtained in order to increase the speed of reading out from the image sensor, it is possible to improve the accuracy of correction patterns for correcting fixed-pattern noise by increasing the number of frames.

Furthermore, in Japanese Patent No. 5132386, a method is proposed in which detection of fixed-pattern noise is performed in advance for each of a plurality of reading methods of an image sensor and correction values are then generated so that the correction values are switched at the time of switching the reading methods.

However, in the method described in Japanese Patent No. 4144517, correction values are calculated from the beginning in the case where fixed-pattern shapes change. Examples of methods for reading out pixel signals of an image sensor include a combined reading method in which the signals of multiple pixels in a horizontal direction and in a vertical direction are combined and then read out, and a non-combined reading method in which the signals of all pixels are read out one pixel at a time. The combined reading method is used for generating a moving image for which fast readout is required, and the non-combined reading method is used for generating a high definition still image. Here, in the case where horizontal-direction combining is performed in the combined reading method, fixed-pattern noise is totaled to appear as one column, resulting in fixed-pattern shapes different from those caused in the case of the non-combined reading method.

When the reading method is switched, the number of samples of the fixed-pattern detection rows decreases and the S/N ratio of correction values becomes smaller. Therefore, there has been a problem in that fixed-pattern noise in images immediately after switching the reading methods could not be corrected accurately.

Also, in a method described in Japanese Patent No. 5132386, although switching of reading methods is handled, detection is performed in advance to generate correction values, and therefore there is a problem in that correction cannot be performed accurately in the case where fixed-pattern noise shapes change due to temperature change or the like.

SUMMARY OF THE INVENTION

The present invention has been made in light of the above problems, and provides an image capturing apparatus that can perform accurate fixed-pattern noise correction for a plurality of reading methods of an image sensor.

According to the first aspect of the present invention, there is provided an image capturing apparatus comprising: an image sensor having a plurality of pixels and being capable of outputting a plurality of image signals read out using different methods for reading out signals of the plurality of pixels individually and correction signals for correcting the plurality of image signals; a processing unit configured to process the correction signals so as to individually handle the reading methods for the plurality of image signals, and a correction unit configured to individually correct the plurality of image signals using the correction signals processed by the processing unit.

According to the second aspect of the present invention, there is provided a control method of an image capturing apparatus comprising an image sensor having a plurality of pixels and being capable of outputting a plurality of image signals read out using different methods for reading out signals of the plurality of pixels individually and correction signals for correcting the plurality of image signals, the method comprising; a processing step of processing the correction signals so as to individually handle the reading method for the plurality of image signals; and a correcting step of individually correcting the plurality of image signals using the correction signals processed by the processing step.

According to the third aspect of the present invention, there is provided a computer-readable storage medium storing programs for a computer to execute a control method of an image capturing apparatus comprising an image sensor having a plurality of pixels and being capable of outputting a plurality of image signals read out using different methods for reading out signals of the plurality of pixels individually and correction signals for correcting the plurality of image signals, the method comprising; processing the correction signals so as to individually handle the reading method for the plurality of image signals; and individually correcting the plurality of image signals using the correction signals processed by the processing step.

Further features of the present invention will become apparent from the following description of exemplary embodiments with reference to the attached drawings.

DESCRIPTION OF THE EMBODIMENTS

Hereinafter, embodiments of the present invention will be described in detail with reference to attached drawings.

First Embodiment

The first embodiment will describe, with reference to drawings, a configuration and operations for enabling accurate fixed-pattern noise correction even in the case where a horizontal-direction (row-direction) pixel combining method of an image sensor over consecutive frames is switched.

Figure 1:
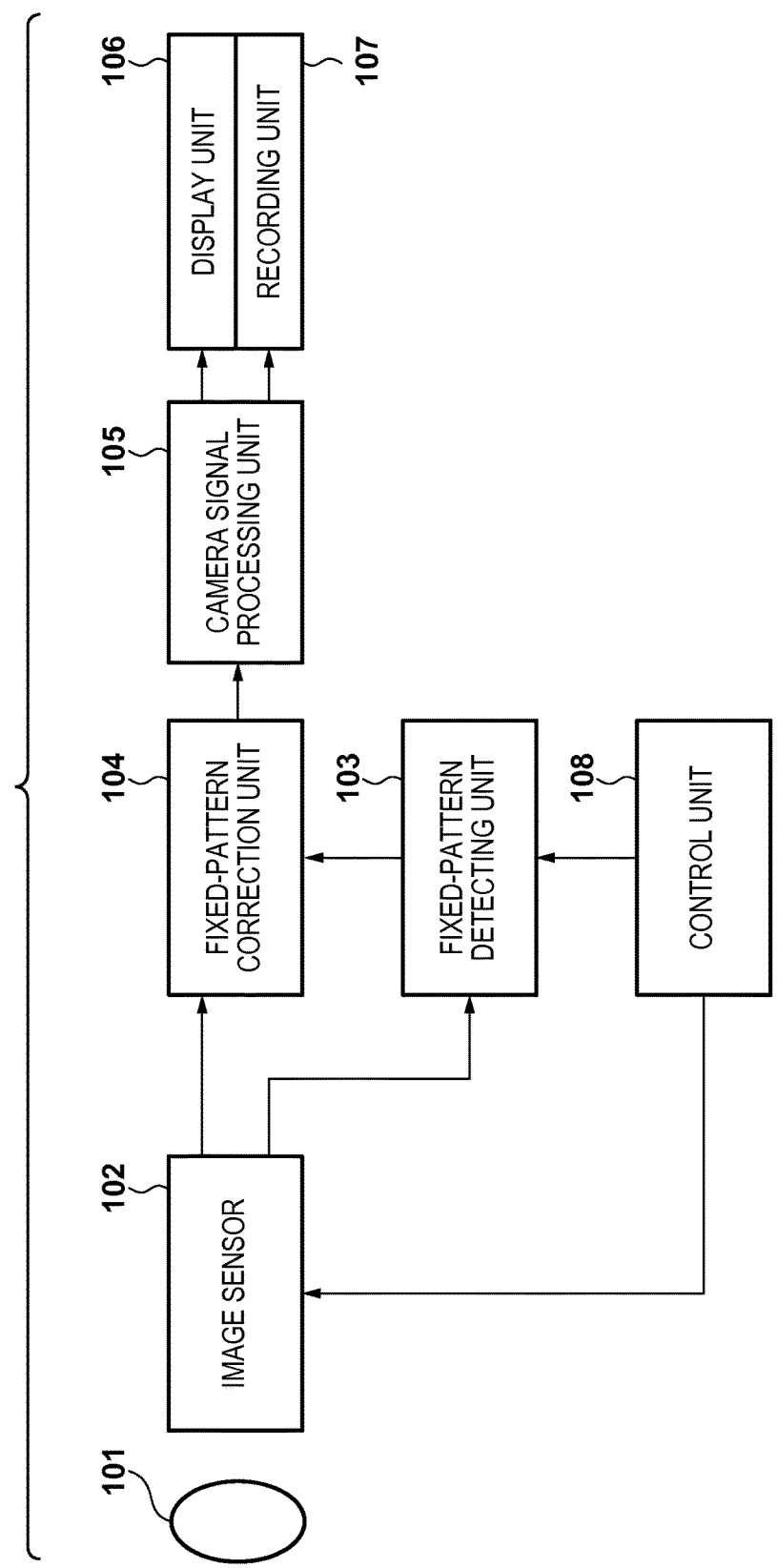
FIG. 1 is a block diagram showing an exemplary configuration of an image capturing apparatus according to a first embodiment.

FIG. 1 is a block diagram showing an exemplary configuration of an image capturing apparatus according to this embodiment. In FIG. 1, an optical system 101 is constituted by a zoom lens, a diaphragm, a focus lens, a shift lens and the like and forms object images. An image sensor 102 has a light shielded pixel area (reference pixel area) which is optically shielded from light and an exposed effective pixel area, and the image signals of the respective areas can be distinguished when being read out. A fixed-pattern detecting unit 103 detects fixed-pattern noise in correction signals read out from the light shielded pixel area of the image sensor 102 over multiple frames and generates fixed-pattern correction signals. A fixed-pattern correction unit 104 performs correction by subtracting fixed-pattern correction values generated in the fixed-pattern detecting unit 103 from the image signals output from the effective pixel area of the image sensor 102.

A camera signal processing unit 105 performs camera signal processing such as white balance on the image signals output from the fixed-pattern correction unit 104. A display unit 106 displays the image signals output from the camera signal processing unit 105 on a display apparatus such as a liquid crystal panel. A storage unit 107 stores the image signals output from the camera signal processing unit 105 on a storage medium such as an SD card. Furthermore, a control unit 108 controls reading methods for the respective areas in the image sensor 102 and controls the fixed-pattern detecting unit 103 in accordance with the reading methods.

Figure 2:
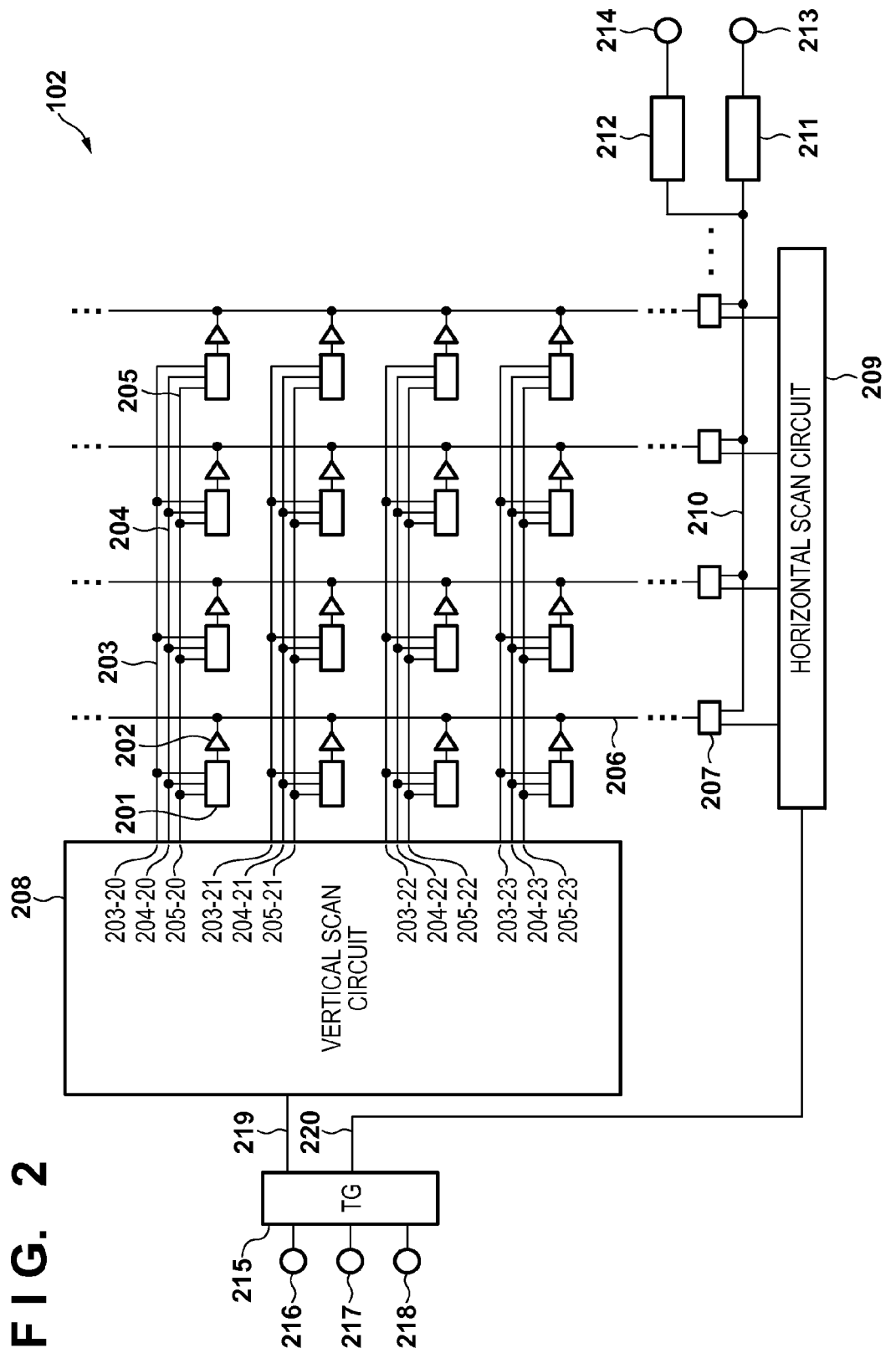
FIG. 2 is a diagram showing an internal configuration of an image sensor according to a first embodiment.

FIG. 2 is a diagram showing the configuration of the image sensor 102. As shown in FIG. 2, the image sensor 102 includes unit pixels 201, floating diffusion amplifiers (hereinafter, abbreviated as FD amplifier) 202, and row reading control lines 203 (20th row to 23rd row are denoted by 203-20 to 203-23). The detailed configuration of one unit pixel 201 will be described with reference to FIG. 3, which will be described later. The image sensor 102 also includes row reset control lines 204 (20th row to 23rd row are denoted by 204-20 to 204-23) and row select lines 205 (20th row to 23rd row are denoted by 205-20 to 205-23).

The image sensor 102 further includes column signal lines 206, column amplifiers and A/D conversion circuits 207, a vertical scan circuit 208, a horizontal scan circuit 209, a row signal line 210, pixel adding circuits 211, 212, signal output terminals 213, 214, and a timing generator (hereinafter, abbreviated as TG) 215.

The TG 215 generates reset timings and reading timings according to settings. The TG 215 is provided with a vertical synchronization signal input terminal 216 and a horizontal synchronization signal input terminal 217, and is connected to a setting signal line 218 used for setting reset and reading out by an external control unit. The TG 215 outputs a reading row timing signal 219 to the vertical scan circuit 208 and a reading column timing signal 220 to the horizontal scan circuit 209.

Figure 3:
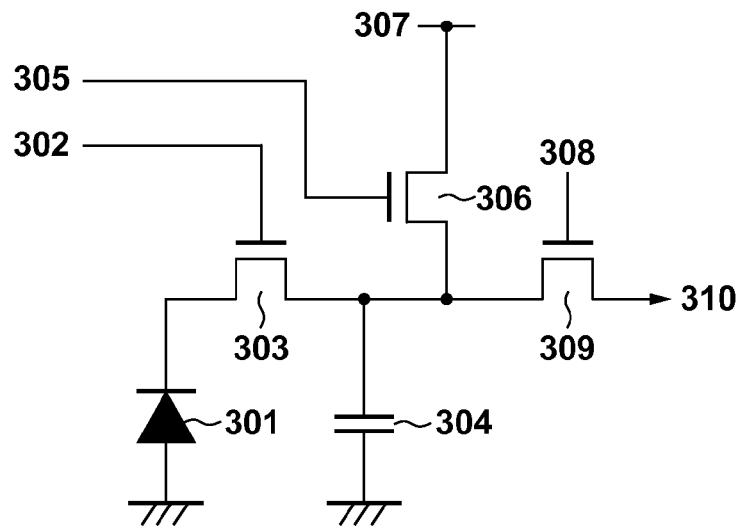
FIG. 3 is a diagram showing a configuration of a unit pixel of an image sensor.

FIG. 3 is a diagram showing an exemplary configuration of the unit pixel 201 of FIG. 2. As shown in FIG. 3, the unit pixel 201 includes a photodiode (hereinafter, abbreviated as "PD") 301, a row reading control input 302 connected to the row reading control line 203 of FIG. 2, and a row reading transistor 303. The unit pixel 201 also includes a floating diffusion (hereinafter, abbreviated as "FD") 304, a row reset control input 305 connected to the row reset control line 204 of FIG. 2, and a row reset transistor 306. The unit pixel 201 further includes a reset level input 307, a row select control input 308 connected to the row select line 205 of FIG. 2, a row select transistor 308, and a pixel output 310.

Figure 4:
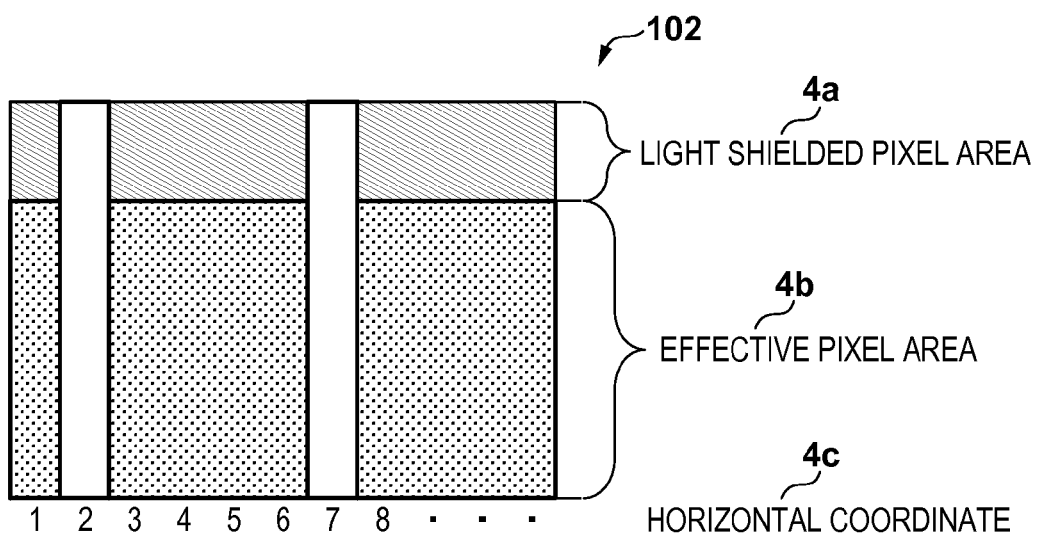
FIG. 4 is a diagram showing a light shielded pixel area and an effective pixel area of an image sensor.

FIG. 4 is a schematic diagram showing image data read out from the image sensor 102. As shown in FIG. 4, the image data read out from the image sensor 102 is composed of light shielded pixel area data (reference pixel area data) 4a and effective pixel area data 4b. Fixed-pattern noise caused by variation in the properties of each column caused by the column amplifiers and A/D conversion circuits 207 inside the image sensor 102 appears as vertical stripe-shaped noise such as that shown in the second column and seventh column of horizontal coordinates 4c, for example. Such fixed-pattern noise caused by the circuits provided for the respective columns appears in a similar manner in the light shielded pixel area data 4a and the effective pixel area data 4b. Accordingly, it is possible to correct fixed-pattern noise in the effective pixel area data 4b by detecting fixed-pattern noise components in the light shielded pixel area data 4a and subtracting the components from the effective pixel area data 4b. Because the S/N ratio is small in the case where the number of rows of the light shielded pixel area data 4a is small, fixed-pattern noise is usually detected over multiple frames using the values of the light shielded pixel area data 4a.

Next, the operations of the first embodiment of the present invention will be described with reference to FIG. 1, FIG. 2, FIG. 3, FIG. 4 and FIG. 5. In FIG. 1, reset/reading timings of respective pixel groups for each field or frame are set in the TG 215 within the image sensor 102 by the control unit 108. When an object image is formed by the optical system 101 on the light receiving surface of the image sensor 102, electric charges are generated in the photodiodes of each pixel group in the image sensor 102 in accordance with reset/reading timings and an incident light amount in each pixel.

The operations within the image sensor 102 will be described. In FIG. 3, the FD 304 is composed of a capacitance of a predetermined amount, and generates a voltage corresponding to the electric charge of this amount of the capacitance. First, when the row reset transistor 306 operates due to a level change in the row reset control input 305, the reset level input (power source VDD) 307 charges the FD 304 and the FD 304 reaches the reset level.

On the other hand, the electric charges corresponding to the incident light amount on each pixel are accumulated in the photodiodes 301, and when the row reading transistor 303 operates due to a level change in the row reading control input 302, the electric charges of the photodiode 301 are moved to the FD 304. At this time, in the FD 304, the voltage level changes in accordance with the amount of the electric charges that have been added to the reset level. This is now the signal level of this pixel, and when the row select transistor 309 operates due to a level change in the row select control input 308, the signal is converted into a pixel voltage signal in the FD amplifier 202 in FIG. 2. The signal is then amplified in the column amplifier and A/D conversion circuit 207 via the column signal line 206 and converted into digital data.

The signals in each column are sequentially read out in the horizontal scan circuit 209, and input into the pixel adding circuits 211, 212 via the row signal line 210. The pixel adding circuit 211 performs horizontal-direction (row-direction) pixel combining processing on the image signals 4b of the effective pixel area for each frame in accordance with an instruction from the control unit 108. The pixel adding circuit 212 performs pixel combining processing on the image signals 4a of the light shielded pixel area in accordance with an instruction from the control unit 108. Thereafter, the image signals of the effective pixel area are output from the signal output terminal 213, and the image signals of the light shielded pixel area are output as correction signals from the signal output terminal 214.

Figure 5:
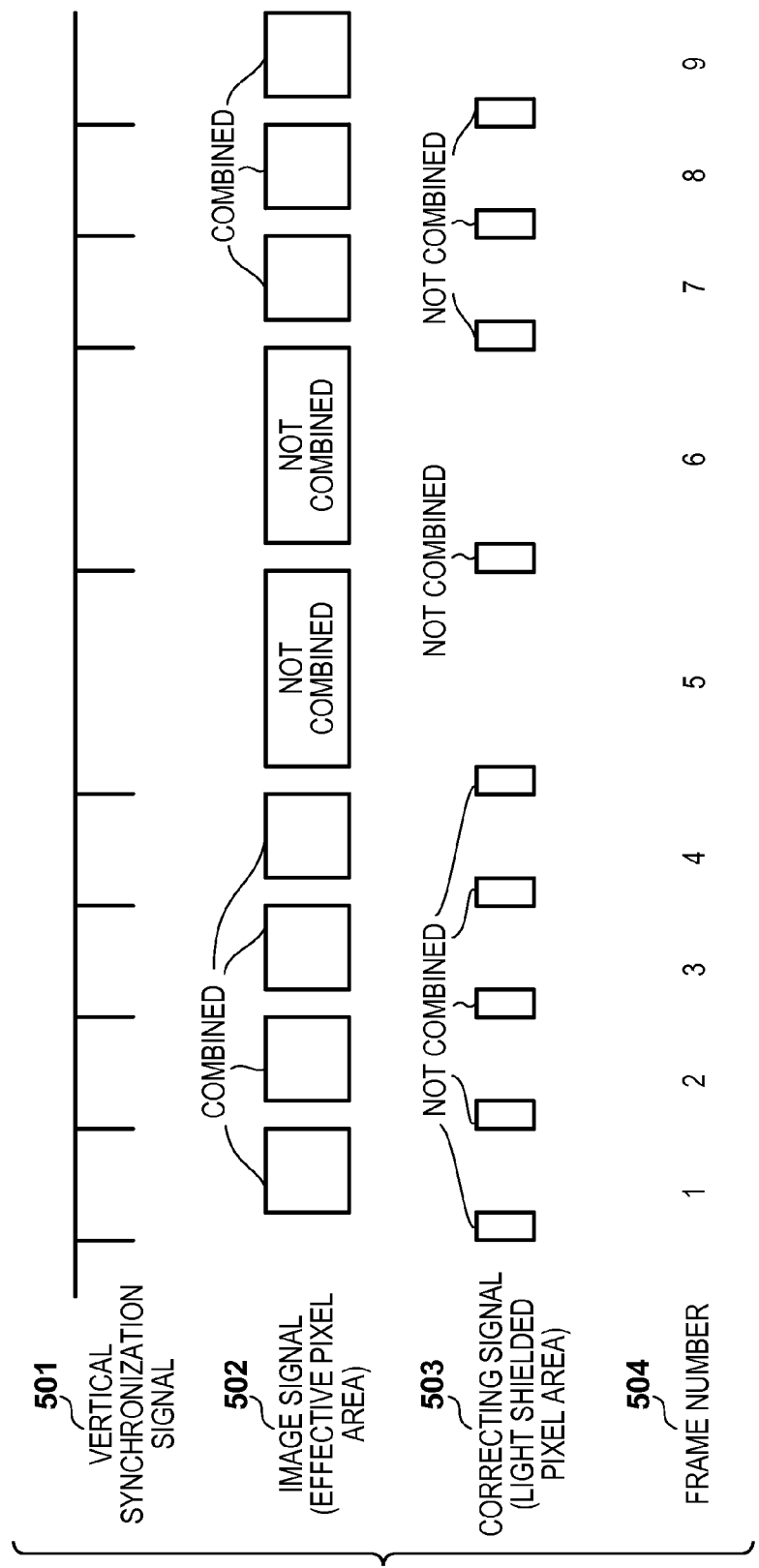
FIG. 5 is a timing chart showing operations according to a first embodiment.

FIG. 5 is a timing chart showing a case where frames in which pixel combining of image signals from the image sensor is performed and frames in which pixel combining is not performed exist in consecutive frames. At a timing synchronizing with a vertical synchronization signal 501, image signals 502 of each frame are output from the signal output terminal 213, and correction signals 503 of each frame are output from the signal output terminal 214.

In FIG. 5, as for frames whose frame numbers 504 are 1, 2, 3, 4, 7, 8 and 9, the image signals created by the pixel adding circuit 211 combining the pixel outputs of the effective pixel area are output from the signal output terminal 213 of FIG. 2, and as for frames whose frame numbers 504 are 5 and 6, image signals that have not undergone combining processing are output. On the other hand, the pixel outputs of the light shielded pixel area are output from the signal output terminal 214 of FIG. 2, with all the frames 1 through 9 in a non-combined state.

The fixed-pattern detecting unit 103 of FIG. 1 performs detection of fixed-pattern noise using the correction signals of the multiple frames output from the signal output terminal 214. At this time, the correction signals remain uncombined even if a state of the image signals output from the signal output terminal 213 is switched between combined and non-combined, and therefore it is possible to perform detection of fixed-pattern noise in a stable manner.

Thereafter, the fixed-pattern detecting unit 103 generates fixed-pattern correction values for the detected fixed-pattern noise in accordance with a combined/uncombined state of the signals for images. Specifically, the fixed-pattern noise is subjected to horizontal-direction (row-direction) combining processing so as to handle horizontal-direction (row-direction) combining processing in the pixel adding circuit 211, and fixed-pattern correction values are generated.

The fixed-pattern correction unit 104 subtracts the fixed-pattern correction values output from the fixed-pattern detecting unit 103 from the image signals output from the signal output terminal 213 of the image sensor 102 to correct the fixed-pattern noise. After the above processing is performed, the camera signal processing circuit 105 performs predetermined camera signal processing, the display unit 106 performs display, and the storage unit 107 performs storage.

In this manner, in the present embodiment, even in the case where a reading mode of the image sensor is switched and fixed-pattern noise of the effective pixel area changes, detection of fixed-pattern noise is performed without switching the reading mode of the light shielded pixel area (reference pixel area). Then, it is possible to perform excellent fixed-pattern noise correction by generating fixed-pattern correction values for the detected fixed-pattern noise so as to handle readout of an effective pixel area, thereby performing correction.

Second Embodiment

In this second embodiment, the configuration and operations for enabling accurate fixed-pattern noise correction in the case where multiple image signals including image signals that undergo horizontal-direction (row-direction) pixel combining of the image sensor and image signals that do not undergo pixel combining are output will be described with reference to the drawings.

Figure 6:
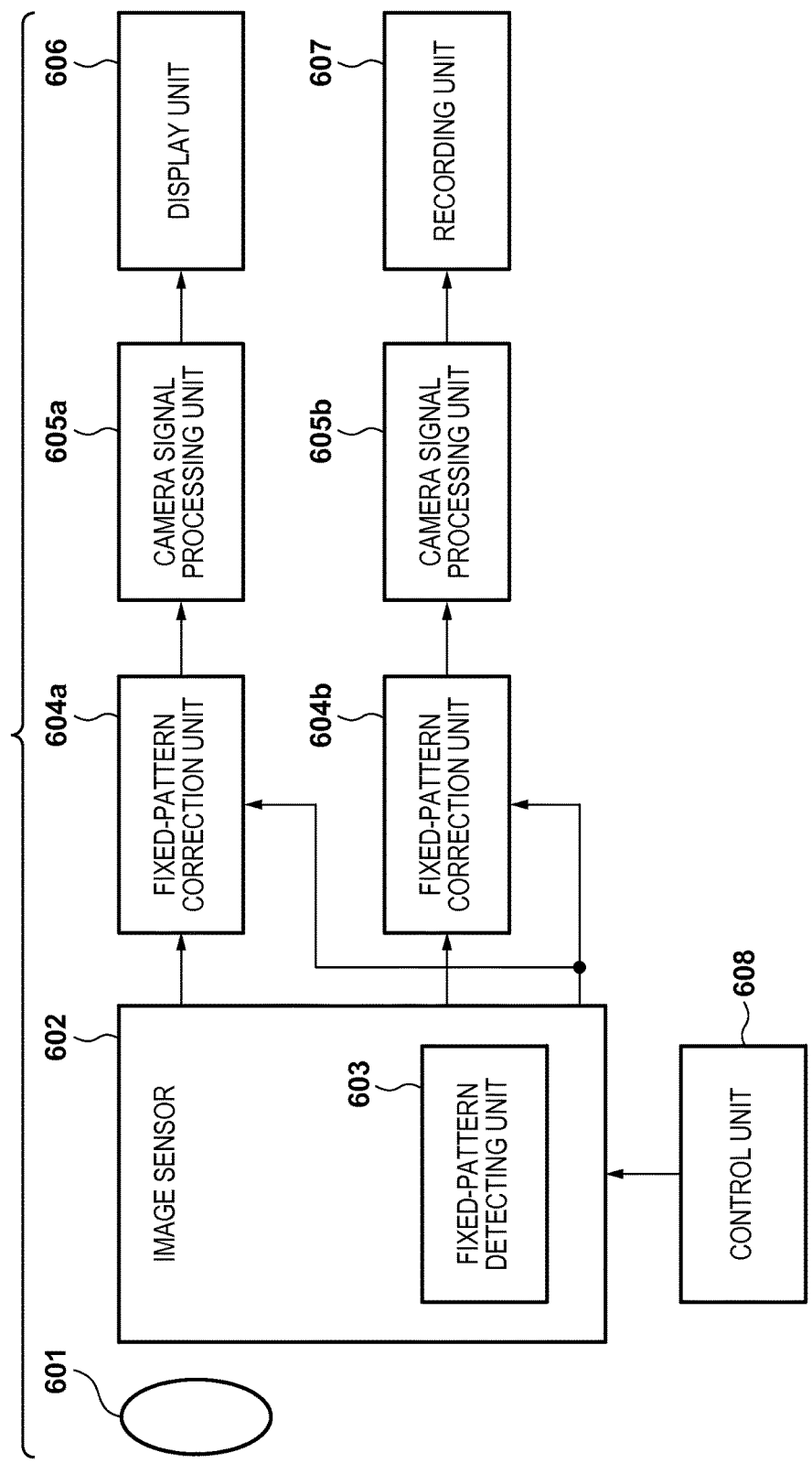
FIG. 6 is a block diagram showing an exemplary configuration of an image capturing apparatus according to a second embodiment.

FIG. 6 is a block diagram showing an exemplary configuration of the image capturing apparatus according to the present embodiment. An optical system 601 is constituted by a zoom lens, a diaphragm, a focus lens, a shift lens and the like and forms object images. An image sensor 602 has a light shielded pixel area (reference pixel area) which is optically shielded from light and an exposed effective pixel area, and can output multiple image signals with different reading methods for the effective pixel area. The image sensor 602 also includes a fixed-pattern detecting unit 603 for detecting fixed-pattern noise from the light shielded pixel area for the respective image signals.

The fixed-pattern detecting unit 603 detects fixed-pattern noise from the correction signals read out from the light shielded pixel area of the image sensor 102 over multiple frames, and generates fixed-pattern correction signals. Fixed-pattern correction units 604a, 604b subtract the fixed-pattern correction value generated in the fixed-pattern detecting unit 603 from each of the multiple image signals output from the effective pixel area of the image sensor 602 and perform correction.

Camera signal processing circuits 605a, 605b perform camera signal processing such as white balance on the image signals output from the fixed-pattern correction units 604a, 604b. A display unit 606 displays the image signals output from the camera signal processing unit (circuit?) 605a on a display apparatus such as a liquid crystal panel. A storage unit 607 records the image signals output from the camera signal processing unit (circuit?) 605b on a recording medium such as an SD card. Furthermore, a control unit 608 controls reading methods of the respective areas in the image sensor 602 and controls the fixed-pattern detecting unit 603 in accordance with a reading method.

Figure 7:
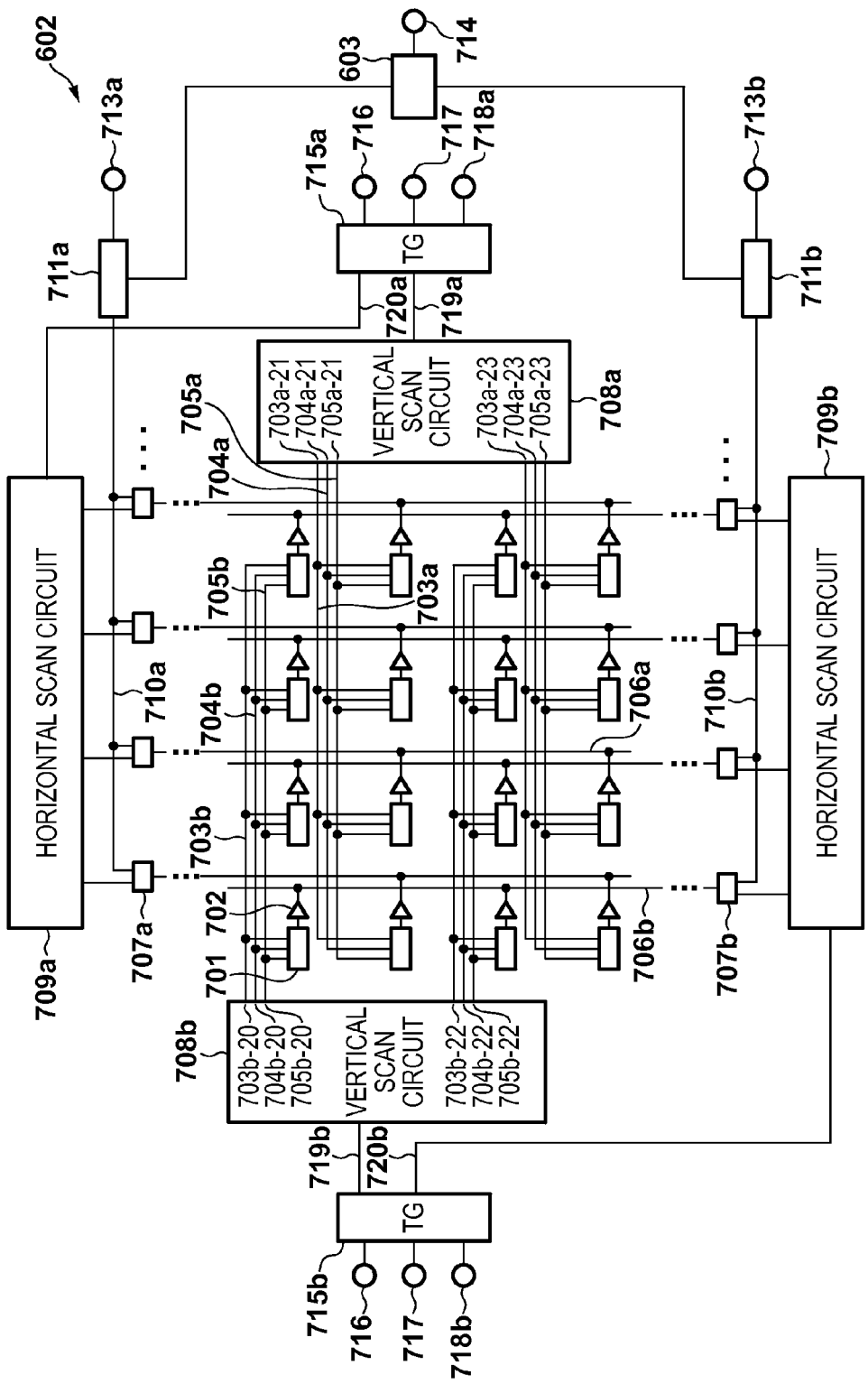
FIG. 7 is a diagram showing an internal configuration of an image sensor according to a second embodiment.

FIG. 7 is a diagram of the configuration of the image sensor 602. As shown in FIG. 7, the image sensor 602 includes unit pixels 701 and floating diffusion amplifiers (hereinafter, abbreviated as "FD amplifier") 702. Detailed configuration of the unit pixel 701 is as shown by FIG. 3 described above.

The image sensor 602 also includes row reading control lines 703a, 703b (20th row to 23rd row are denoted by 703a-20 to 703a-23 and 703b-20 to 703b-23) and row resetting control lines 704a, 704b (20th row to 23rd row are denoted by 704a-20 to 704a-23 and 704b-20 to 704b-23).

Furthermore, the image sensor 602 includes row selecting lines 705a, 705b (20th row to 23rd row are denoted by 705a-20 to 705a-23 and 705b-20 to 705b-23), column signal lines 706a, 706b, amplifiers and A/D conversion circuits 707a, 707b, vertical scan circuits 708a, 708b, horizontal scan circuits 709a, 709b, and row signal lines 710a, 710b.

Pixel adding circuits 711a, 711b include the fixed-pattern detecting unit 603, signal output terminals 713a, 713b, 714, and timing generators (hereinafter, abbreviated as "TG") 715a, 715b. The TGs 715a, 715b generate reset timings and reading timings in accordance with settings.

The TGs 715a, 715b include a vertical synchronization signal input terminal 716 and a horizontal synchronization signal input terminal 717, and have setting signal lines 718a, 718b, which are used for setting reset and reading, connected thereto from an external CPU. The TGs 715a, 715b output reading row timing signals 719a, 719b to the vertical scan circuits 708a, 708b and output reading column timing signals 720a, 720b to the horizontal scan circuits 709a, 709b.

FIG. 7 shows an example in which members of a first pixel group (connected to the circuits denoted by reference numerals with the letter "a" added) and members of a second pixel group (connected to the circuits denoted by reference numerals with the letter "b" added) are discretely arranged in alternate rows or columns. However, the present invention is not necessarily limited to the arrangement shown in this example.

FIG. 3 is a diagram showing an exemplary configuration of one unit pixel 701 of FIG. 7. FIG. 4 is a schematic diagram showing the light shielded pixel area (reference pixel area) and the effective pixel area of the image sensor 602. Description of FIG. 3 and FIG. 4 will be omitted because it would be same as the first embodiment.

Next, the operations of the present embodiment will be described with reference to FIG. 3, FIG. 6, FIG. 7 and FIG. 8. In FIG. 6, the control unit 608 sets, in the TG 715 inside the image sensor 602, reset/reading timings of each pixel group for each field or frame. When the optical system 601 forms an object image on the light receiving surface of the image sensor 602, electric charges are generated on the photodiodes of each pixel group on the image sensor 602 in accordance with reset/reading timings and incident light amount in each pixel.

The operations inside the image sensor 602 will be described. In FIG. 3, the FD 304 is composed of a capacitance of a predetermined amount, and generates a voltage corresponding to the electric charge of this amount of the capacitance. First, when the row reset transistor 306 is operated due to a level change in the row reset control input 305, the reset level input (power source VDD) 307 charges the FD 304 and the FD 304 achieves a reset level.

On the other hand, the electric charges corresponding to the incident light amount of each pixel is accumulated in the photodiode 301, and when the row reading transistor 303 is operated due to a level change in the row reading control input 302, the electric charges of the photodiode 301 is moved to the FD 304. At this time, in the FD 304, the voltage level change of the amount of the electric charges that has been added to the reset level occurs. This is now the signal level of this pixel, and when the row select transistor 309 operates due to a level change in the row select control input 308, the signal is converted into a pixel voltage signal in FD amplifier 702 of FIG. 7. The signals are then amplified in the column amplifiers and A/D conversion circuits 707a, 707b via column signal lines 706a, 706b and converted into digital data.

The signals in each column are sequentially read out in the horizontal scan circuits 709a, 709b, and input into the pixel adding circuits 711a, 711b via the row signal lines 710a, 710b.

The pixel adding circuit 711a performs horizontal-direction (row-direction) pixel combining processing on the image signals 4a of the effective pixel area read out from the row signal line 710a in accordance with the instruction from the control unit 608, and outputs them from the signal output terminal 713a. The pixel adding circuit 711b performs horizontal-direction (row-direction) pixel combining processing on the image signals 4a of the effective pixel area, which were read out from the row signal line 710b in accordance with the instruction from the control unit 608 and outputs them from the signal output terminal 713b.

Also, outputs of the pixel adding circuits 711a, 711b are input into the fixed-pattern detecting unit 603. The fixed-pattern detecting unit 603 performs detection of fixed-pattern noise for each of the image signals 4a of the light shielded pixel area read out from the pixel adding circuit 711a and image signals 4b of the light shielded pixel area read out from the pixel adding circuit 711b in accordance with the instruction from the control unit 608. Fixed-pattern correction values for the noise are then generated. The generated fixed-pattern correction value is output from the signal output terminal 714 as a correction signal.

Figure 8:
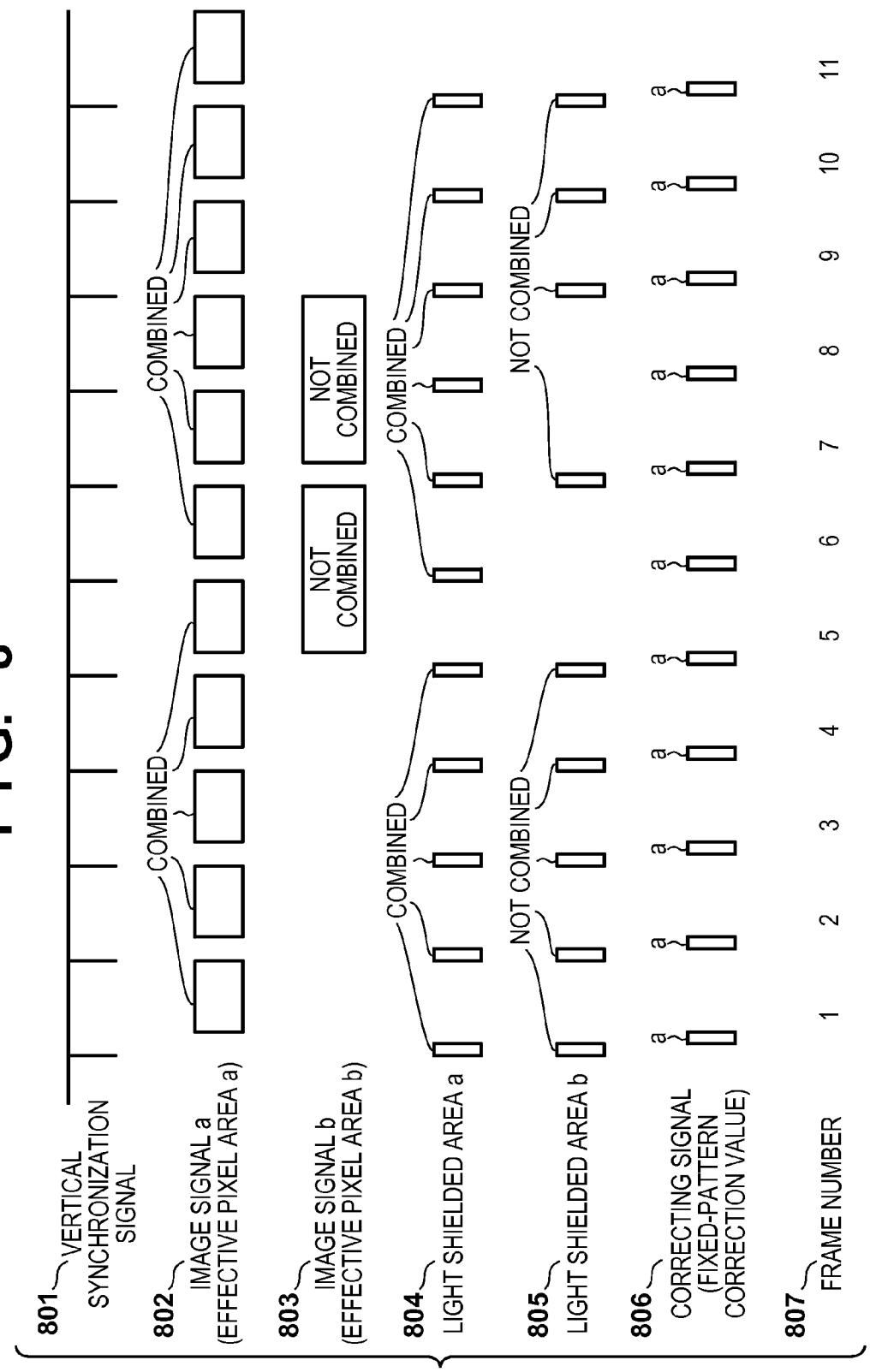
FIG. 8 is a timing chart showing operations according to a second embodiment.

FIG. 8 is a timing chart showing a state of outputting multiple image signals including, over consecutive frames, image signals a that undergo horizontal-direction (row-direction) pixel combining of the image sensor and image signals b that do not undergo pixel combining. At a timing synchronizing with a vertical synchronization signal 801, image signals a (802) of the effective pixel area a are output from the signal output terminal 713a, and image signals b (803) of the effective pixel area b are output from the signal output terminal 713b.

Image signals a (804) of the light shielded pixel area a corresponding to the image signals a (802) of the effective pixel area a and image signals b (805) of the light shielded pixel area b corresponding to the image signals b (803) of the effective pixel area b are also individually output from the signal output terminals 713a, 713b. Correction signals 806 are generated from the image signals a (804) of the light shielded pixel area a and the image signals b (805) of the light shielded area b by the fixed-pattern detecting unit 603, and output from the signal output terminal 714.

In FIG. 8, as for the frames whose frame numbers 807 are 1, 2, 3, 4, 9, 10 and 11, the image signals a (802) created by the pixel adding circuit 711a combining the pixel outputs of the effective pixel area are output from the signal output terminal 713a. On the other hand, for the frames whose frame numbers 807 are 5, 6, 7 and 8, the pixel outputs of the effective pixel area are not combined by the pixel adding circuit 711b, and the image signals b (803) in a non-combined state are output from the signal output terminal 713b. Because images that have not undergone combining processing have a large number of pixels, signals of one frame are output during periods of two frames (the frames with frame numbers 5 and 6, and the frames with frame numbers 7 and 8, individually).

The fixed-pattern detecting unit 603 of FIG. 6 performs detection of fixed-pattern noise individually for the image signals a (804) of the light shielded pixel area a corresponding to the image signals a (802) of the effective pixel area a and the image signals b (805) of the light shielded pixel area b corresponding to the image signals b (803) of the effective pixel area b.

The image signals a (802) of the effective pixel area a and the image signals a (804) of the light shielded pixel area a pass through the same column amplifier and A/D conversion circuit 707a and the pixel adding circuit 711a. Also, the image signals b (803) of the effective pixel area b and the image signals b (805) of the light shielded pixel area b pass through the same column amplifier and A/D conversion circuit 707b and the pixel adding circuit 711b. Accordingly, it is possible to detect fixed-pattern noise independently.

Furthermore, as for the frames (frame numbers 1, 2, 3, 4, 9, 10, 11) for which the image signals b (803) of the effective pixel area b are not output, it is possible to consecutively perform detection of fixed-pattern noise by reading out only the pixel signals a (804) of the light shielded pixel area a so as to perform detection of fixed-pattern noise even in the case where switching is performed between outputting and not outputting image signals from the signal output terminal 713b, and thereby highly accurate detection is made possible.

Furthermore, it is desirable that the correction values generated from the detected fixed-pattern noise are output as correction signals 806 in accordance with the output of image signals to be corrected. In FIG. 8, as for the frames having frame numbers 5 and 7 for which the image signals b (803) of the effective pixel area b are output, correction values a and b respectively generated from the fixed-pattern noise detected in the light shielded pixel area a and the light shielded pixel area b are both output, and as for the other frames, correction values a generated from the fixed-pattern noise detected in the light shielded pixel area a are output.

Thereafter, the fixed-pattern correction units 604a, 604b deduct the fixed-pattern correction values a and the fixed-pattern correction values b output from the signal output terminal 714 respectively from the image signals a output from the signal output terminal 714a and the image signals b output from the signal output terminal 714b so as to correct the fixed-pattern noise. After the above processing is performed, the camera signal processing circuits 605a, 605b perform predetermined camera signal processing, the display unit 606 performs display, and the storage unit 607 performs recording.

In this manner, even in the case where multiple image signals including image signals that undergo pixel combining by the image sensor and image signals that do not undergo pixel combining are output, it is possible to perform excellent fixed-pattern noise correction by consecutively performing detection of fixed-pattern noise from the light shielded pixel area in accordance with the respective methods for combining image signals during correction processing.

Third Embodiment

Figure 9A:
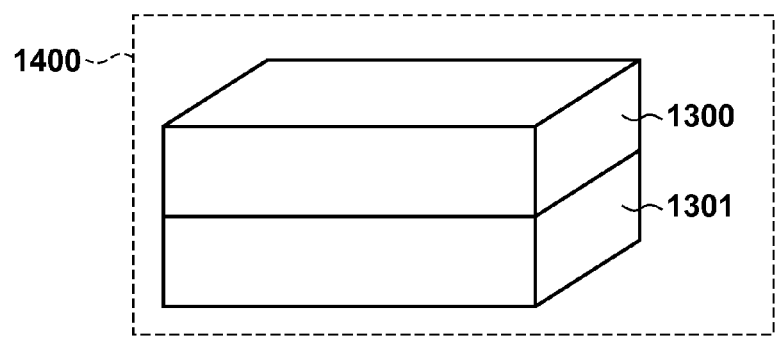
FIGS. 9A and 9B are diagrams showing a configuration of an image sensor according to a third embodiment.
Figure 9B:
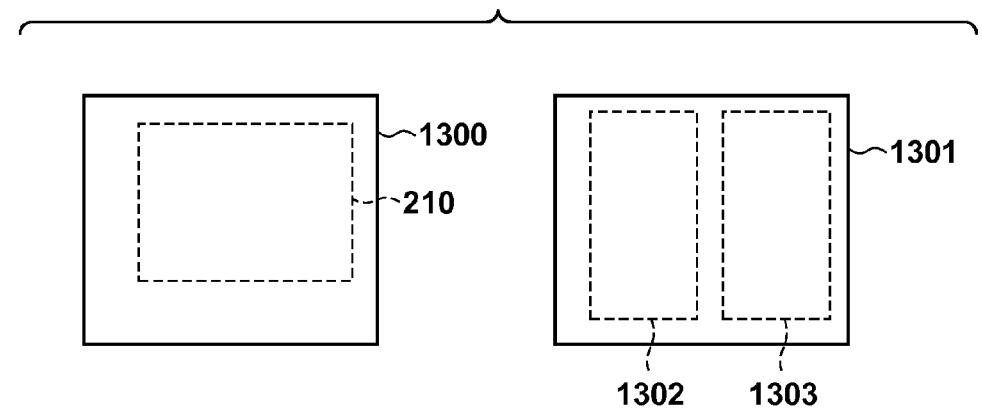

Next, a third embodiment of the present invention will be described. In this embodiment, an example of an image sensor 1400 (corresponding to the image sensors 102, 602 of the above-described first embodiment and second embodiment) being of a stacked type is illustrated. As shown in FIG. 9, the image sensor 1400 of the present embodiment has a chip 1300 for the image sensor and a chip 1301 for high-speed logic processing mutually stacked at a chip level. FIG. 9A is a perspective diagram of the respective chips, and FIG. 9B is a top view of the respective chips. The chip 1300 for the image sensor includes an area including pixel units 210 constituted by the unit pixels 201 and the FD amplifiers 202 of FIG. 2 or the unit pixels 701 and the FD amplifiers 702 of FIG. 7, and the chip 1301 for high-speed logic processing includes a portion that includes digital data and can perform high speed processing, such as a column AD circuit and a horizontal scan circuit.

Fourth Embodiment

Figure 10:
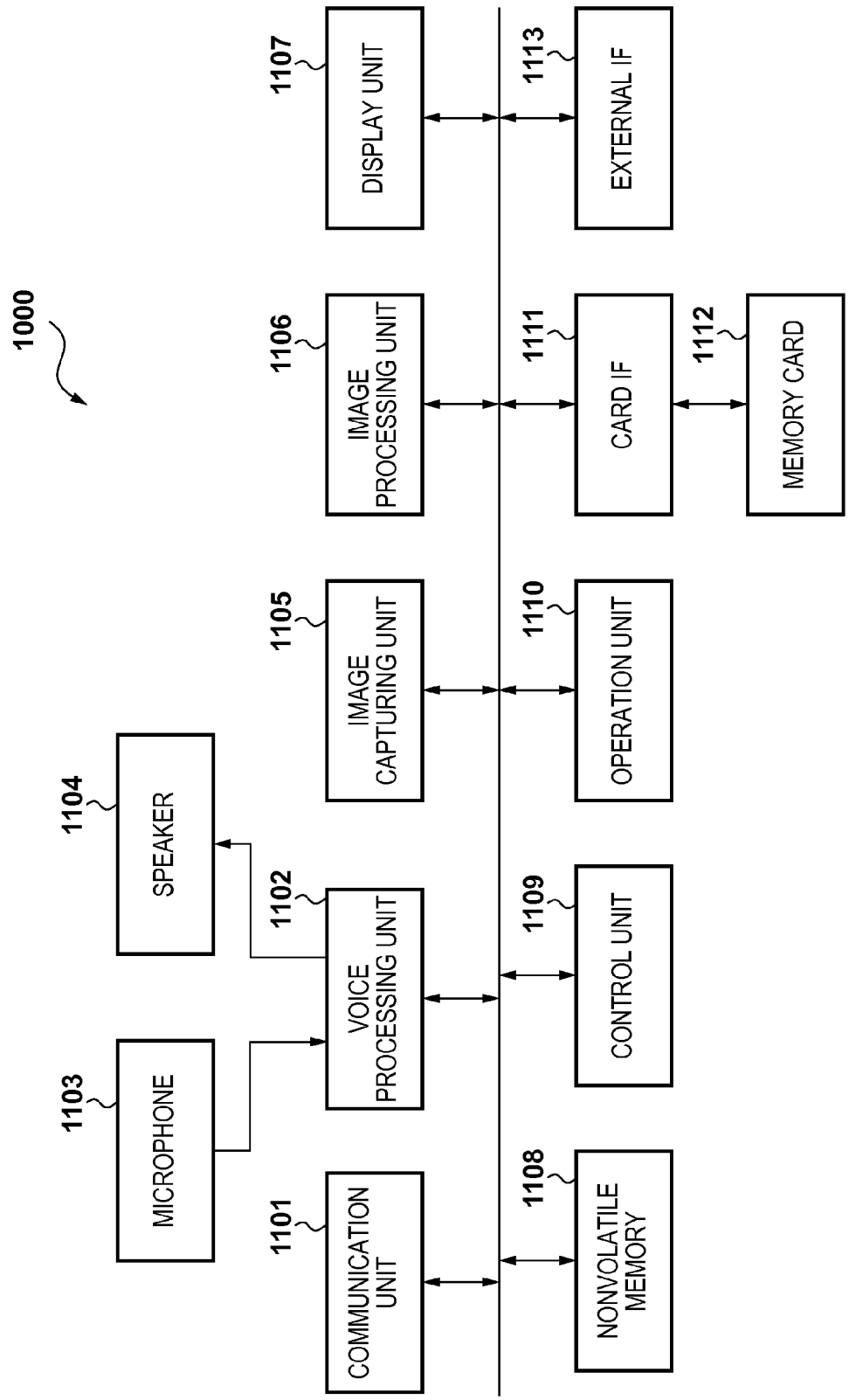
FIG. 10 is a block diagram showing a configuration of a mobile phone machine according to a fourth embodiment.

FIG. 10 is a block diagram showing the configuration of a mobile phone machine 1000 as a fourth embodiment of the present invention. The mobile phone machine 1000 of the present embodiment has, in addition to an audio communication function, an e-mail function, an Internet connection function, an image shooting and reproduction function and the like.

In FIG. 10, a communication unit 1101 communicates audio data or image data with another telephone machine using a communication system in accordance with a communication carrier with which a user has contracted. An audio processing unit 1102 converts, during audio communication, audio data from a microphone 1103 into a format suitable for transmission and sends it to the communication unit 1101. The audio processing unit 1102 also decodes audio data from a communication partner, which was sent through the communication unit 1101, and sends it to a speaker 1104. An image capturing unit 1105 is provided with an image sensor having any of the configurations of the above-described first embodiment to third embodiment, shoots object images, and outputs image data. When shooting images, an image processing unit 1106 processes image data shot by the image capturing unit 1105, converts the data into a format suitable for recording, and outputs the data. When reproducing the recorded images, the image processing unit 1106 also processes the reproduced images and sends them to a display unit 1107. The display unit 1107 is provided with a liquid crystal panel of about a few inches, and displays various types of screens in accordance with an instruction from a control unit 1109. The nonvolatile memory 1108 stores data such as address book information, e-mail data, and image data shot by the image capturing unit 1105.

The control unit 1109 has a CPU, a memory and the like, and controls each unit of the telephone machine 1100 in accordance with control programs stored in the memory (not illustrated). An operation unit 1110 is provided with a power source button, number keys, and other various types of operation keys for a user to input data. A card IF 1111 records/reproduces various types of data on/from a memory card 1112. An external IF 1113 transmits data stored in the nonvolatile memory 1108 and the memory card 1112 to an external device, and receives data transmitted from an external device. The external IF 1113 performs communication using a known communication method such as a wired communication method such as USB, or wireless communication.

Next, the audio communication function of the telephone machine 1100 will be described. In the case where a telephone call is made to a communication partner, a user operates the number keys of the operation unit 1110 to input communication partner's phone number, or an address book stored in the nonvolatile memory 1108 is displayed on the display unit 1107, where the user selects the communication partner and instructs an outgoing call. When an outgoing call is instructed, the control unit 1109 sends the outgoing call to the communication partner via the communication unit 1101. When the communication partner receives an incoming call, the communication unit 1101 outputs the partner's audio data to the audio processing unit 1102 and transmits the user's audio data to the partner.

Furthermore, in the case of transmitting an e-mail, a user instructs e-mail preparation using the operation unit 1110. When e-mail preparation is instructed, the control unit 1109 displays a screen for e-mail preparation on the display unit 1107. The user inputs a transmission destination address or the body of the e-mail using the operation unit 1110, and instructs transmission. When e-mail transmission is instructed, the control unit 1109 sends data of the address information and the body of the e-mail to the communication unit 1101. The communication unit 1101 converts the e-mail data into a format suitable for communication and sends it to the transmission partner. Upon receiving the e-mail, the communication unit 1101 also converts the data of the received e-mail into a format suitable for display and displays it on the display unit 1107.

Next, the shooting function of the telephone device 1100 will be described. After operating the operation unit 1110 to set a shooting mode, a user instructs shooting of a still image or a moving image, and the image capturing unit 1105 shoots a still image data or moving image data and sends it to the image processing unit 1106. The image processing unit 1106 processes the shot still image data or moving image data, and stores it in the nonvolatile memory 1108. The image processing unit 1106 also sends the shot still image data or moving image data to the card IF 1111. The card IF 1111 stores the still image data or the moving image data in the memory card 1112.

Furthermore, the telephone machine 1100 can transmit a file containing still image data or moving image data shot in this manner as an attached file of an e-mail. Specifically, when an e-mail is transmitted, an image file stored in the nonvolatile memory 1108 or the memory card 1112 is selected and transmission of the file as an attached file is instructed.

The telephone machine 1100 can also transmit a file containing shot still image data or moving image data to an external device such as a PC or another telephone machine using the external IF 1113. The user operates the operation unit 1110, selects an image file stored in the nonvolatile memory 1108 or the memory card 1112, and instructs transmission. The control unit 1109 controls the external IF 1113 so as to read out the selected image file from the nonvolatile memory 1108 or the memory card 1112 and to transmit it to an external device.

OTHER EMBODIMENTS

Embodiments of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiments and/or that includes one or more circuits (e.g., application specific integrated circuit (ASIC)) for performing the functions of one or more of the above-described embodiments, and by a method performed by the computer of the system or apparatus by, for example, reading out and executing the computer executable instructions from the storage medium to perform the functions of one or more of the above-described embodiments and/or controlling the one or more circuits to perform the functions of one or more of the above-described embodiments. The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-158986, filed Aug. 4, 2014 which is hereby incorporated by reference herein in its entirety.

What is claimed is:

1. An image capturing apparatus comprising:
   an image sensor having a plurality of pixels and being capable of outputting signals of pixels of an effective pixel area among the plurality of pixels as image signals and signals of pixels of a reference pixel area among the plurality of pixels as correction signals in which a plurality of pixel signals are combined;
   a processor which generates correction values based on the correction signals by combining the pixel signals of the reference pixel area so as to handle a method of combining the pixel signals of the effective pixel area in the image sensor, and
   a corrector which corrects the image signals using the correction values,
   wherein even in a case where the image signals are output with different methods of combining the pixel signals of the pixels of the effective pixel area, the image sensor outputs the correction signals without changing a method of combining the pixel signals of the reference pixel area.

2. The image capturing apparatus according to claim 1, wherein the image sensor performs detection of the fixed-pattern noise also during a period in which output of the image signals is not performed.

3. The image capturing apparatus according to claim 1, wherein
   the corrector performs correction of the image signals using the fixed-pattern noise during a period in which output of the image signals is performed.

4. The image capturing apparatus according to claim 1, wherein
   the image sensor is of a stacked type in which a plurality of chips are mutually stacked.

5. The image capturing apparatus according to claim 1, wherein the processor detects fixed-pattern noise in the correction signals and generates the correction values.

6. The image capturing apparatus according to claim 1, wherein the image sensor is capable of outputting the image signals and the correction signals in which a plurality of pixel signals are combined in a row direction.

7. A control method of an image capturing apparatus comprising an image sensor having a plurality of pixels and being capable of outputting signals of the pixels of the effective pixel area among the plurality of pixels as image signals and signals of the pixels of the reference pixel area among the plurality of pixels as correction signals in which a plurality of pixel signals are combined, the method comprising:

generating correction values based on the correction signals by combining the pixel signals of the reference pixel area so as to handle a method of combining the pixel signals of the effective pixel area in the image sensor; and correcting the image signals using the correction values, wherein even in a case where the image signals are output with different methods of combining the pixel signals of the pixels of the effective pixel area, the image sensor outputs the correction signals without changing a method of combining the pixel signals of the reference pixel area.

8. The control method of the image capturing apparatus according to claim 7, wherein the image sensor performs detection of the fixed-pattern noise also during a period in which output of the image signals is not performed.

9. The control method of image capturing apparatus according to claim 7, wherein correcting the image signal is performed using the fixed-pattern noise during a period in which output of the image signals is performed.

10. The control method according to claim 7, wherein in the generating, fixed-pattern noise in the correction signals is detected and the correction values are generated.

11. The control method according to claim 7, wherein the image sensor is capable of outputting the image signals and the correction signals in which a plurality of pixel signals are combined in a row direction.

12. A non-transitory computer-readable storage medium storing programs for a computer to execute a control method of an image capturing apparatus comprising an image sensor having a plurality of pixels and being capable of outputting signals of the pixels of the effective pixel area among the plurality of pixels as image signals and signals of the pixels of the reference pixel area among the plurality of pixels as correction signals in which a plurality of pixel signals are combined, the method comprising:

generating correction values based on the correction signals by combining the pixel signals of the reference pixel area so as to handle a method of combining the pixel signals of the effective pixel area in the image sensor and correcting the image signals using the correction values, wherein even in a case where the image signals are output with different methods of combining the pixel signals of the pixels of the effective pixel area, the image sensor outputs the correction signals without changing a method of combining the pixel signals of the reference pixel area.

* * * * *